United States Patent [19]

Chiulli

[11] Patent Number: 5,268,245
[45] Date of Patent: Dec. 7, 1993

[54] PROCESS FOR FORMING A FILTER ON A SOLID STATE IMAGER

[75] Inventor: Carl A. Chiulli, Randolph, Mass.

[73] Assignee: Polaroid Corporation, Cambridge, Mass.

[21] Appl. No.: 911,001

[22] Filed: Jul. 9, 1992

[51] Int. Cl.$^5$ ................................................. G03F 9/00
[52] U.S. Cl. .......................................... 430/7; 430/293;
430/321; 430/330; 430/394; 430/145; 430/165;
430/191
[58] Field of Search .................... 430/7, 293, 294, 321,
430/323, 329, 330, 394, 145, 165, 191; 350/311,
333

[56] References Cited

U.S. PATENT DOCUMENTS

| | | | |
|---|---|---|---|
| 3,957,515 | 5/1976 | Robillard | 96/48 HD |
| 4,515,877 | 5/1985 | Barzynski et al. | 430/5 |
| 4,555,471 | 11/1985 | Barzynski et al. | 430/273 |
| 4,592,975 | 6/1986 | Young et al. | 430/5 |
| 4,687,728 | 8/1987 | Folkard et al. | 430/270 |
| 4,808,501 | 2/1989 | Chiulli | 430/7 |
| 4,816,376 | 3/1989 | Toshida | 430/290 |
| 4,837,098 | 6/1989 | Shimamura et al. | 430/7 |
| 4,942,103 | 7/1990 | Reithel et al. | 430/7 |
| 4,965,073 | 10/1990 | Maruyama et al. | 430/292 |
| 4,980,260 | 12/1990 | Shinozaki et al. | 430/138 |
| 5,053,299 | 10/1991 | Hanrahan et al. | 430/7 |
| 5,059,500 | 10/1991 | Needham et al. | 430/7 |
| 5,079,214 | 1/1992 | Long et al. | 503/227 |
| 5,096,801 | 3/1992 | Koya et al. | 430/293 |
| 5,100,764 | 3/1992 | Paulson et al. | 430/311 |

Primary Examiner—Marion E. McCamish
Assistant Examiner—S. Rosasco
Attorney, Agent, or Firm—David J. Cole

[57] ABSTRACT

A filter is formed on a solid state imager by:

forming, on the imaging surface of the imager, an adherent layer of a dye-containing photoresist composition comprising a photoresist resin and a thermochromic dye, this dye being substantially non-absorbent of actinic radiation of a first wavelength, but capable, upon heating, of undergoing a thermally-induced color change which renders it absorptive of actinic radiation of the first wavelength;

imagewise exposing the adherent layer of dye-containing photoresist composition to actinic radiation of the first wavelength;

removing one of the exposed and unexposed areas of the layer, while leaving the other of the exposed and unexposed areas on the imaging surface, to form a pattern of filter elements; and heating the solid state imager to a temperature and for a time sufficient to cause the dye to undergo its color change, thereby causing the filter elements to become absorptive of radiation of the first wavelength.

This process avoids the long exposure times otherwise required when forming filter elements of a color which strongly absorbs the exposing radiation.

17 Claims, No Drawings

PROCESS FOR FORMING A FILTER ON A SOLID STATE IMAGER

This invention relates to a process for forming a filter on a solid state imager, and to a solid state imager provided with this filter.

To obtain color image recording using solid state imagers such as charge coupled devices, optical filters in a multicolor stripe or mosaic form are employed; in many cases, these filters are formed directly upon the photosensitive surface of the solid state imager. Such filters are normally provided with elements having two or three differing colors. (The term "having color" is used herein to mean "transmitting electromagnetic radiation of a particular wavelength", and does not necessarily refer to visible radiation.) For example, a two color filter may have yellow and cyan elements which overlap in part, the overlap area providing, in effect, a green element. A three color filter will typically have red, green and blue, or cyan, yellow and magenta elements.

A number of processes are described in the art for preparing such filters. For example, U.S. Pat. No. 4,239,842 describes a process for producing a color filter array by depositing successively on a semiconductive layer, such as a charge coupled device, a sub-coat, a polymeric mordant, and a photoresist. The photoresist layer is exposed and developed to form a mask, and dye is then heat-transferred through the apertures in the photoresist into the polymeric mordant. Finally, the photoresist is stripped.

U.S. Pat. No. 4,565,756 describes a color filter formed by laying on a substrate a transparent layer, forming by photolithography a pattern of filter elements separated by separation regions (grooves or dye-impermeable regions) in the transparent layer, laying a barrier layer over the transparent layer, forming by photolithography a pattern of apertures in the barrier layer, this pattern of apertures corresponding to the location of a first system of filter elements, dyeing the first system of filter elements through these apertures, and finally removing the barrier layer. The formation of the barrier layer and the subsequent steps of the process are then repeated for other colors.

A variety of techniques have also been developed for producing the fine lines and other image elements needed in the production of integrated electrical circuits and in lithography. For example, U.S. Pat. No. 3,873,361 describes a process for producing thin films for integrated circuits by depositing a) a photoresist (polymeric) layer which is baked to render it non-photosensitive; b) a metallic layer; c) a second photoresist layer, then exposing and developing the second photoresist layer to form a mask, etching the exposed metallic layer through this mask, using the metallic mask so produced to remove exposed polymeric layer, preferably by sputter etching, depositing a metallic film in areas where the bottom polymeric layer has been removed, and finally removing, by conventional lift-off solvent methods, the remaining parts of the metallic layer and the bottom polymeric layer.

U.S. Pat. No. 4,808,501 describes a process for forming a color filter on a support, such as a charge coupled device, by (a) forming a layer on a support with a composition comprising a positive photoresist and a dye, the dye being soluble in the solvent of the photoresist; (b) exposing predetermined portions of the layer to radiation adapted to increase the solubility of the coating in the exposed areas; (c) developing the exposed areas to form a pattern of filter elements; and (d) repeating these steps with a different color dye in the composition; wherein the dye constitutes in excess of 10% by weight, dry basis of the composition, is substantially non-absorptive in the exposure wavelength of the composition, and provides predetermined absorptive characteristics for the specified filter element and the dye possesses substantially the same polarity as the composition U.S. Pat. No. 5,059,500, issued Oct. 22, 1991, describes a process for forming a filter using differential reactive ion etching techniques. This process comprises:

providing on the substrate a layer of an absorber material having predetermined absorption and transmission characteristics;

providing a layer of a barrier material superposed on the layer of absorber material, the barrier material being more susceptible to reactive ion etching than the absorber material under a first set of etching conditions, but resistant to reactive ion etching under a second set of etching conditions under which the absorber material is susceptible to etching;

providing a layer of a photoresist material superposed on the layer of barrier material;

patternwise exposing the layer of photoresist material and developing the exposed layer to remove either the exposed or non-exposed regions thereof, thereby to bare the regions of the barrier layer underlying the removed regions of the photoresist material, the remaining regions of the photoresist material being resistant to reactive ion etching under said first set of etching conditions but susceptible to reactive ion etching under said second set of etching conditions;

reactive ion etching the coated substrate under said first set of etching conditions, thereby etching away the bared regions of the barrier layer and baring selected regions parts of the absorber layer, but not etching away the remaining regions of the photoresist material nor substantially etching away the bared regions of the absorber layer; and reactive ion etching the coated substrate under said second set of etching conditions, thereby etching away the remaining regions of the photoresist layer and the bared regions of the absorber layer, and thereby forming a filter on the substrate.

The processes described in the aforementioned U.S. Pat. Nos. 4,808,501 and 5,059,500 give excellent results. However, the process of U.S. Pat. No. 4,808,501 does require that the dye be substantially non-absorptive in the exposure wavelength of the composition, and this creates difficulties in forming a yellow filter element with some commercial photoresists. Many commercial novolak photoresists are designed for exposure using the G line of a mercury lamp at 436 nm., and yellow dyes tend to absorb this line strongly. Thus, these yellow dyes, when used at the very high concentrations required in the process of U.S. Pat. No. 4,808,501, require very long exposure times, since the high concentration of yellow dye in the photoresist absorbs much of the 436 nm. light used to expose the photoresist. The process of U.S. Pat. No. 5,059,500 does require the use of reactive ion etching equipment.

The present invention provides a process for forming, on a solid state imager, a filter having elements which absorb strongly at the exposure wavelength of a photoresist, without requiring very long exposure times, and without the need for reactive ion etching equipment.

SUMMARY OF THE INVENTION

Accordingly, this invention provides a process for forming a filter on a solid state imager, which process comprises:

forming, on the imaging surface of the imager, an adherent layer of a dye-containing photoresist composition comprising a photoresist resin and a thermochromic dye, this dye being substantially nonabsorbent of actinic radiation of a first wavelength, but capable, upon heating, of undergoing a thermally induced color change which renders it absorptive of actinic radiation of the first wavelength;

imagewise exposing the adherent layer of dye containing photoresist composition to actinic radiation of the first wavelength;

removing one of the exposed and unexposed areas of the layer, while leaving the other of the exposed and unexposed areas on the imaging surface, to form a pattern of filter elements; and heating the solid state imager to a temperature and for a time sufficient to cause the dye to undergo its color change, thereby causing the filter elements to become absorptive of radiation of the first wavelength.

This invention also provides a solid state imager having on its imaging surface a filter comprising a plurality of colored filter elements, the filter being formed of a photoresist resin and an image dye which absorbs radiation of a first wavelength in the range of about 360 to 530 nm, the image dye being formed from a thermochromic dye which is substantially non-absorbent of actinic radiation of the first wavelength, but which, upon heating, generates the image dye.

DETAILED DESCRIPTION OF THE INVENTION

As already mentioned, in the present process there is formed, on the imaging surface of a solid state imager, an adherent layer of a dye-containing photoresist composition comprising a photoresist resin and a thermochromic dye. This thermochromic dye is, in its original state, substantially non-absorbent of actinic radiation of a first wavelength, but capable, upon heating, of undergoing a thermally-induced color change which renders it absorptive of actinic radiation of the first wavelength Typically, the dye-containing photoresist composition is applied as a liquid to the imaging surface of the solid state imager and dried to form an adherent layer on this surface, then this adherent layer is imagewise exposed to actinic radiation of the first wavelength. Application of the liquid dye-containing photoresist composition to the solid state imager may be effected by dipping, spraying, spin coating or other methods conventional in the photoresist art. The coating is dried by removal of solvent from the dye-containing photoresist composition, whereupon good adhesion of the entire coating to the solid state imager is obtained. Since the adherent layer of dye-containing photoresist composition is substantially non-absorbent of this radiation, the presence of the thermochromic dye in the photoresist composition does not significantly affect the exposure required by the photoresist, so that this exposure can be kept to a minimum.

Following exposure, the photoresist is developed in any conventional manner. Thus, depending upon the photoresist employed, the photoresist may be developed mechanically. However, typically the photoresist is developed by applying a solvent (typically water or an aqueous alkaline solution) to the photoresist, thereby removing either the exposed or unexposed areas of the layer (depending upon whether a positive or negative photoresist is employed), leaving the remaining areas of the layer affixed to the imaging surface, and forming a pattern of filter elements on the solid state imager. The solid state imager is then heated to a temperature and for a time sufficient to cause the thermochromic dye to undergo its color change, thus causing the filter elements to become absorptive of radiation of the first wavelength.

Typically, the heating step of the present process is not an additional step as compared with prior art processes for the formation of filters on solid state imagers. Most photoresist resins require a stabilization step after exposure and development, and this stabilization step is normally effected by heating the developed photoresist or by exposing it to ultraviolet radiation. Accordingly, in many cases the heating step of the present process will simply be the same as, or very similar to, the heating step required to stabilize the developed photoresist, and no additional steps are required to achieve the advantages of the present invention.

The heating step should of course be carried out in a manner which does not cause substantial deterioration of the photoresist layer. Although the exact time and temperature of heating employed in the present process will vary with the photoresist resin and thermochromic dye employed, in general it is preferred that the heating be carried out between about 145° C. and about 165° C. for a period of not more than about 1 hour, and desirably at a temperature of not more than about 155° C. for a period of not more than about 40 minutes.

The actinic radiation of the first wavelength used to expose the photoresist in the present process may be any wavelength to which the photoresist is sensitive and of which the thermochromic dye is substantially non-absorbent Most commercial photoresists are intended for exposure with near ultraviolet or blue visible radiation, and thus, in the present process, the first wavelength will typically be in the range of about 360 to 530 nm, desirably in the range of about 380 to 500 nm. Specifically, the first wavelength may be that of the mercury G line, 436 nm.

The thermochromic dye used in the present process may be any thermochromic dye which is substantially non-absorbent of actinic radiation of the first wavelength and which can be caused to undergo its color change by heating under conditions which do not cause substantial damage to the solid state imager. Thus, for example, the thermochromic dye may be as described in U.S. Pat. No. 3,957,515 and 4,555,975. Obviously, the thermochromic dye should be chosen so that the image dye produced upon heating is stable under the conditions under which the solid state imager is to be used. Because of their color development at relatively low temperatures, the thermochromic dye is preferably one selected from:

a. an organic compound capable of undergoing, upon heating, an irreversible unimolecular fragmentation of at least one thermally unstable carbamate moiety, this organic compound initially absorbing radiation in the visible or the non-visible region of the electromagnetic spectrum, said unimolecular fragmentation visibly changing the appearance of the organic compound (see U.S. Pat. No. 4,602,263);

b. a substantially colorless di- or triarylmethane imaging compound possessing within its di- or triarylmethane structure an aryl group substituted in the ortho position to the meso carbon atom with a moiety ring-closed on the meso carbon atom to form a 5- or 6-membered ring, said moiety possessing a nitrogen atom bonded directly to said meso carbon atom and said nitrogen atom being bound to a group with a masked acyl substituent that undergoes fragmentation upon heating to liberate the acyl group for effecting intramolecular acylation of said nitrogen atom to form a new group in the ortho position that cannot bond to the meso carbon atom, whereby said di- or triarylmethane compound is rendered colored (see U.S. Pat. No. 4,720,449);

c. a colored di- or triarylmethane imaging compound possessing within its di- or triarylmethane structure an aryl group substituted in the ortho position to the meso carbon atom with a thermally unstable urea moiety, said urea moiety undergoing a unimolecular fragmentation reaction upon heating to provide a new group in said ortho position that bonds to said meso carbon atom to form a ring having 5 or 6 members, whereby said di- or triarylmethane compound becomes ring-closed and rendered colorless (see U.S. Pat. No. 4,720,450);

d. in combination, a substantially colorless di- or triarylmethane compound possessing on the meso carbon atom within its di- or triarylmethane structure an aryl group substituted in the ortho position with a nucleophilic moiety which is ring-closed on the meso carbon atom, and an electrophilic reagent which upon heating and contacting said di- or triarylmethane compound undergoes a bimolecular nucleophilic substitution reaction with said nucleophilic moiety to form a colored, ring-opened di- or triarylmethane compound (see U.S. Patent No. 4,745,046);

e. a compound of the formula

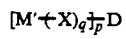

wherein M' has the formula:

wherein R is alkyl; $-SO_2R^1$ is alkyl; phenyl; naphthyl; r phenyl substituted with alkyl, alkoxy, halo, trifluoromethyl, cyano, nitro, carboxy, $-CONR^2R^3$ wherein $R^2$ and $R^3$ each are hydrogen or alkyl, $-CO_2R^4$ wherein $R^4$, is alkyl or phenyl, $-COR^5$ wherein $R^5$ is amino, alkyl or phenyl, $-NR^6R^7$ wherein $R^6$ and $R^7$ each are hydrogen or alkyl, $-SO_2NR^8R^9$ wherein $R^8$ and $R^9$ each are hydrogen, alkyl or benzyl; Z' has the formula:

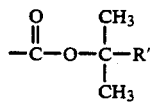

wherein R' is halomethyl or alkyl; X is $-N=$, $-SO_2-$ or $-CH_2-$; D taken with X and M' represents the radical of a color-shifted organic dye; q is 0 or 1; and p is a whole number of at least 1; said Z' being removed from said M' upon the application of heat to effect a visually discernible change in spectral absorption characteristics of said dye (see U.S. Pat. No. 4,826,976);

f. a substantially colorless di- or triarylmethane compound of the formula:

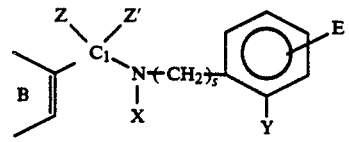

wherein ring B represents a carbocyclic aryl ring or a heterocyclic aryl ring; $C_1$ represents the meso carbon atom of said di- or triarylmethan compound; X represents $-C(=O)-$; $-SO_2-$ or $-CH_2-$ and completes a moiety ring-closed on said meso carbon atom, said moiety including the nitrogen atom bonded directly to said meso carbon atom; Y represents $-NH-C(=O)-L$, wherein L is a leaving group that departs upon thermal fragmentation to unmask $-N=C=O$ for effecting intramolecular acylation of said nitrogen atom to open the N-containing ring and form a new group in the ortho position of ring B that cannot bond to said meso carbon atom; E is hydrogen, an electron-donating group, an electron-withdrawing group or a group, either an electron-donating group or an electron-neutral group that undergoes fragmentation upon heating to liberate an electron-withdrawing group; s is 0 or 1; and Z and Z' taken individually represent the moieties to complete the auxochromic system of a diarylmethane or triarylmethane dye when said N-containing ring is open, and Z and Z' taken together represent the bridged moieties to complete the auxochromic system of a bridged triarylmethane dye when said N-containing ring is open (see U.S. Pat. No. 4,960,901);

g. a colorless precursor of a preformed image dye substituted with (a) at least one thermally removable protecting group that undergoes fragmentation from said precursor upon heating and (b) at least one leaving group that is irreversibly eliminated from said precursor upon heating, provided that neither said protecting group nor said leaving group is hydrogen, said protecting and leaving groups maintaining said precursor in its colorless form until heat is applied to effect removal of said protecting and leaving groups whereby said colorless precursor is converted to an image dye (see International Patent Application No. PCT/US89/02965 and U.S. applications Ser. Nos. 07/729,420 and 07/729,426, both filed Jul. 12, 1991);

h a mixed carbonate ester of a quinophthalone dye and a tertiary alkanol containing not more than about 9 carbon atoms (see application Ser. No. 07/548,223, filed Jun. 29, 1990)

i. a leuco dye represented by:

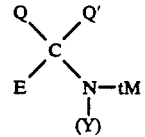

wherein:
E represents a thermally removable leaving group;
tM represents a thermally migratable acyl group;
Q, Q' and C taken together represent a dye-forming coupler moiety wherein C is the coupling carbon of said coupler moiety;

and, (Y) taken together with N represents an aromatic amino color developer, one of said Q, Q' and (Y) containing an atom selected from the atoms comprising Group 5A/Group 6A of the Periodic Table, said groups E and tM maintaining said leuco dye in a substantially colorless form until the application of heat causes said group E to be eliminated from said leuco dye and said group tM to migrate from said N atom to said Group 5A/Group 6A atom thereby forming a dye represented by:

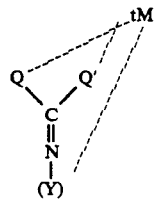

wherein said dotted lines indicate that said tM group is bonded to said Group 5A/Group 6A atom in one of said Q, Q' and (Y) (See application Ser. No. 07/696,151, filed May 6, 1991).

of these thermochromic dyes, those of subparagraph (i) are especially preferred, with a specific preferred dye being that of formula:

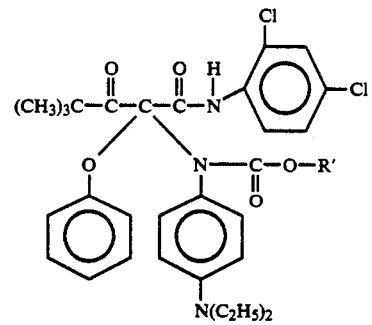

(hereinafter referred to as "Thermochromic Dye A"), which develops a strong yellow color after heating to about 145° C. for 30 minutes.

The photoresist composition used in the present process may comprise more than one thermochromic dye to enable a variety of colors or shades to be produced in the final filter elements. Alternatively or in addition, the photoresist composition may contain at least one non-thermochromic dye which does not undergo a color change during the heating step. Inclusion of such a non-thermochromic dye may be useful to produce filter elements with varying colors using the same thermochromic dye. For example, mixtures of a yellow thermochromic dye with cyan and magenta dyes will give green and red filter elements respectively. Specific preferred non-thermochromic dyes for use in the present process are:

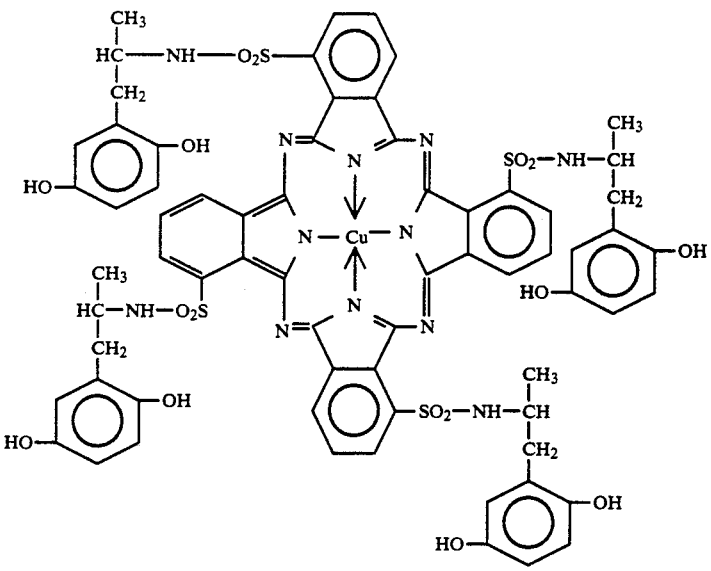

(cyan) and

-continued

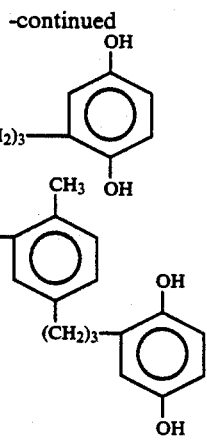

(magenta).

Apart from the inclusion of the thermochromic dye in the photoresist composition, the present process is desirably carried out as described in the aformentioned U.S. Pat. No. 4,808,501, the disclosure of which is herein incorporated by reference. Thus, desirably, the photoresist resin is a positive photoresist resin and the thermochromic dye has substantially the same polarity as the resin, and preferably the thermochromic dye comprises in excess of 10% up to about 50% of the dye-containing photoresist composition on a dry weight basis.

The term "positive photoresist" is used herein to refer to a composition which, in its dried-down state, when exposed to appropriate wavelength radiation, is rendered more soluble in a developer composition than the unexposed areas, in contrast to a negative photoresist which is inherently soluble in a developer composition and which is cross-linked or hardened by exposure to render it less soluble in the exposed areas. Positive photoresist compositions are generally phenolic-formaldehyde novolak resins employed in conjunction with a sensitizer or photoactive compound which is usually a substituted naphthoquinone diazide compound. The naphthoquinone sensitizer acts as a dissolution rate inhibitor with respect to the novolak resin in aqueous alkaline solution. However, upon exposure to radiation, the sensitizer, which is a hydrophobic material, undergoes a structural transformation which converts its functionality as a dissolution rate inhibitor for the resin to a dissolution rate accelerator for the exposed area of the photoresist. In the present invention, the level of photoactive compound is not critical. The specific amount of photoactive compound is selected with regard to speed or contrast desired. The specific positive photoresist is not critical, and commercially available photoresists may be conveniently employed. Preferably, the photoresist employed has minimal inherent color. A conventional resin/photoactive compound composition would consist of about 80-85% by weight, dry basis, of resin and 15-20% by weight, dry basis, of photoactive compound wherein the two components are mixed or chemically bonded together. Other conventional additives may optionally be employed in the photoresist composition, including plasticizers, adhesion promoters, surfactants and the like.

Using the process of U.S. Pat. No. 4,808,501, it has been found that filters can be prepared employing extremely large quantities of the desired dye. Thus, while another prior art composition may contain 15-20% by weight, dry basis, of photoactive compound and a composition designed to control reflected light would only contain a few percent dye, the composition disclosed in U.S. Pat. No. 4,808,501 can contain 40-75% by weight, dry basis, of resin, 10-18% by weight, dry basis, of photoactive compound, and in excess of 10% up to 50%, by weight, dry basis, of dye. It will be seen, therefore, that dye can constitute a major portion of the composition, generally equalling, and in many cases exceeding, the quantity of photoactive compound. In some cases, the dye constitutes in excess of 30% by weight of the composition. By employing the large amounts of dye, i.e., in excess of 10% by weight, dry basis, filters having good light transmission characteristics are obtained without the need for very thick filter elements. Thus, the filter elements of the present invention can be 2 μm or less thick.

In the present process, desirably the solid state imager is a charge coupled device, preferably of each defined by a surrounding channel stop, and the process comprises the step of predetermining the portions of the composition to be exposed to radiation by masking selected ones of the elements in a manner so that the edges of the filter elements formed upon the subsequent exposure and development of the selectively masked elements extends over the channel stop surrounding the selectively masked elements. The filter may be formed in any desired pattern, such as a stripe of mosaic pattern, the particular pattern employed being determined by the exposure scheme, e.g., the configuration of the mask.

It will be appreciated that the process of the present invention, as defined above and comprising a single deposit-dry-expose-develop-heat cycle, only deposits filter elements of a single color on the solid state imager, and that if a full-color filter is to be produced, additional steps are required to provide additional filter elements of different colors. These additional filter elements may be formed by one or more further cycles of the process of the present invention, or by prior art processes. In many cases, it will be desirable to form some filter elements by the present process and others by prior art processes. For example, if it desired to produce a red-green-blue (RGB) filter using the mercury G line at 436 nm as the exposing radiation, it will be convenient to form the red and green filter elements using the present process to avoid the long exposure times otherwise required to form these elements because of the strong absorption of the mercury G line by red and green dyes. On the other hand, the blue filter elements can conveniently be formed using the process of the aforementioned U.S. Pat. No. 4,808,501, since blue dyes do not strongly absorb the mercury G line and will thus not require a long exposure time. The present process may also be used to produce a filter in which yellow and cyan filter elements overlap, since, as is known to those skilled in the solid state imager art, such a filter with overlapping yellow and cyan elements acts as a full-color filter.

If desired, the present process can include steps to provide additional layers to impart desired characteristics to the filter. For example, after all of the necessary filter elements have been formed, a protective overcoat can be placed over the filter elements to protect these elements from mechanical abrasion or environmental damage during use.

The following Example is now given, though by way of illustration only, to show details of particularly preferred reagents, conditions and techniques used in the process of the present invention.

EXAMPLE

A 4 inch (102 mm) silicon wafer, on which a charge coupled device has been fabricated, was vapor primed with hexamethyl-disilazane as an adhesion promoter, using a Yield Engineering Systems 3 oven. A dye-containing photoresist composition was prepared by dissolving 5 parts of weight of the aforementioned Thermochromic Dye A in 100 parts by weight of KTI 825 photoresist (a positive, novolak-resin based photoresist sold by OCG Microelectronics Materials, West Patterson N.J. 07424) to give a photoresist composition that was 13.1% by weight thermochromic dye on a dry solids basis. The photoresist composition (4 ml) was then spin coated on to the imaging surface of the charge coupled device, with the device being spun at 3500 r.p.m. for 30 seconds. The coating was dried on a hot plate for two minutes at 95° C. to form a substantially transparent coating approximately 2 μm thick. The device was then aligned and exposed with a Perkin Elmer Micralign Scanner at aperture 1, speed 065, developed by ultrasonic spray for 30 seconds with developer KTI 932 (sold by the aforementioned OCG Microelectronics Materials), diluted 50% with water, rinsed for 60 seconds and spun dry. Finally, the device was baked in an oven at 145° C. for 30 minutes to cause the thermochromic dye to undergo its color change, thereby producing yellow filter elements on the charge coupled device. These 2 μm filter elements transmitted 17.7% of incident 450 nm light.

I claim:

1. A process for forming a filter on a solid state imager, which process comprises:

forming, on the imaging surface of the imager, an adherent layer of a dye-containing photoresist composition comprising a photoresist resin and a thermochromic dye, this dye being substantially non-absorbent of actinic radiation of a first wavelength, but capable, upon heating, of undergoing a thermally-induced color change which renders it absorptive of actinic radiation of the first wavelength;

imagewise exposing the adherent layer of dye-containing photoresist composition to actinic radiation of the first wavelength;

removing one of the exposed and unexposed areas of the layer, while leaving the other of the exposed and unexposed areas on the imaging surface, to form a pattern of filter elements; and heating the solid state imager to a temperature and for a time sufficient to cause the dye to undergo its color change, thereby causing the filter elements to become absorptive of radiation of the first wavelength.

2. A process according to claim 1 wherein the first wavelength is in the range of about 360 to 530 nm.

3. A process according to claim 1 wherein the first wavelength is in the range of about 380 to 520 nm.

4. A process according to claim 1 wherein the thermochromic dye is selected from the group consisting of:

a. an organic compound capable of undergoing, upon heating, an irreversible unimolecular fragmentation of at least one thermally unstable carbamate moiety, this organic compound initially absorbing radiation in the visible or the non-visible region of the electromagnetic spectrum, said unimolecular fragmentation visibly changing the appearance of the organic compound;

b. a substantially colorless di- or triarylmethane imaging compound possessing within its di- or triarylmethane structure an aryl group substituted in the ortho position to the meso carbon atom with a moiety ring-closed on the meso carbon atom to form a 5- or 6-membered ring, said moiety possessing a nitrogen atom bonded directly to said meso carbon atom and said nitrogen atom being bound to a group with a masked acyl substituent that undergoes fragmentation upon heating to liberate the acyl group for effecting intramolecular acylation of said nitrogen atom to form a new group in the ortho position that cannot bond to the meso carbon atom, whereby said di- or triarylmethane compound is rendered colored;

c. a colored di- or triarylmethane imaging compound possessing within its di- or triarylmethane structure an aryl group substituted in the ortho position to the meso carbon atom with a thermally unstable urea moiety, said urea moiety undergoing a unimolecular fragmentation reaction upon heating to provide a new group in said ortho position that bonds to said meso carbon atom to form a ring having 5 or 6 members, whereby said di- or triarylmethane compound becomes ring-closed and rendered colorless;

d. in combination, a substantially colorless di- or triarylmethane compound possessing on the meso carbon atom within its di- or triarylmethane structure an aryl group substituted in the ortho position with a nucleophilic moiety which is ring-closed on the meso carbon atom, and an electrophilic reagent which upon heating and contacting said di- or triarylmethane compound undergoes a bimolecular nucleophilic substitution reaction with said nucleophilic moiety to form a colored, ring-opened di- or triarylmethane compound;

e. a compound of the formula

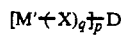

wherein M' has the formula:

wherein R is alkyl; —SO₂R¹ is alkyl; phenyl; naphthyl; or phenyl substituted with alkyl, alkoxy, halo, trifluoromethyl, cyano, nitro, carboxy, —CONR²R³ wherein R² and R³ each are hydrogen or alkyl, —CO₂R⁴ wherein R⁴ is alkyl or phenyl, —COR⁵ wherein R⁵ is amino, alkyl or phenyl, —NR⁶R⁷ wherein R⁶ and R⁷ each are hydrogen or alkyl, —SO²NR⁸R⁹ R⁸ and R⁹ each are hydrogen, alkyl or benzyl; Z' has the formula:

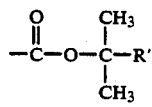

wherein R' is halomethyl or alkyl; X is —N=, —SO²— or —CH₂—; D taken with X and M' represents the radical of a color-shifted organic dye; q is 0 or 1; and p is a whole number of at least 1; said Z' being removed from said M' upon the application of heat to effect a visually discernible change in spectral absorption characteristics of said dye;

f. a substantially colorless di- or triarylmethane compound of the formula:

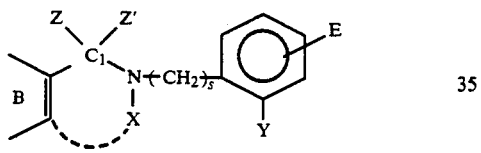

wherein ring B represents a carbocyclic aryl ring or a heterocyclic aryl ring; C₁ represents the meso carbon atom of said di- or triarylmethane compound; X represents —C(=O)—; —SO₂— or —CH₂— and completes a moiety ring-closed on said meso carbon atom, said moiety including the nitrogen atom bonded directly to said meso carbon atom; Y represents —NH—C(=O)—L, wherein L is a leaving group that departs upon thermal fragmentation to unmask —N=C=O for effecting intramolecular acylation of said nitrogen atom to open the N-containing ring and form a new group in the ortho position of ring B that cannot bond to said meso carbon atom; E is hydrogen, an electron-donating group, an electron-withdrawing group or a group, either an electron-donating group or an electron-neutral group that undergoes fragmentation upon heating to liberate an electron-withdrawing group; s is 0 or 1; and Z and Z' taken individually represent the moieties to complete the auxochromic system of a diarylmethane or triarylmethane dye when said N-containing ring is open, and Z and Z' taken together represent the bridged moieties to complete the auxochromic system of a bridged triarylmethane dye when said N-containing ring is open;

g. a colorless precursor of a preformed image dye substituted with (a) at least one thermally removable protecting group that undergoes fragmentation from said precursor upon heating and (b) at least one leaving group that is irreversibly eliminated from said precursor upon heating, provided that neither said protecting group nor said leaving group is hydrogen, said protecting and leaving groups maintaining said precursor in its colorless form until heat is applied to effect removal of said protecting and leaving groups whereby said colorless precursor is converted to an image dye;

h. mixed carbonate ester of a quinophthalone dye and a tertiary alkanol containing not more than about 9 carbon atoms, and i. a leuco dye represented by:

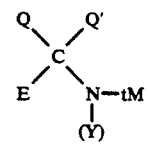

wherein:
E represents a thermally removable leaving group;
tM represents a thermally migratable acyl group;
Q, Q' and C taken together represent a dye-forming coupler moiety wherein C is the coupling carbon of said coupler moiety;
and, (Y) taken together with N represents an aromatic amino color developer,
one of said Q, Q' and (Y) containing an atom selected from the atoms comprising Group 5A/Group 6A of the Periodic Table, said groups E and tM maintaining the application of heat causes said g E to be eliminated from said leuco dye and said group tM to migrate from said N atom to said Group 5A/Group 6A atom thereby forming a dye represented by:

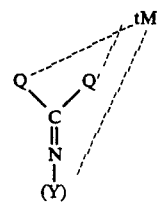

wherein said dotted lines indicate that said tM group is bonded to said Group 5A/Group 6A atom in one of said Q, Q' and (Y).

5. A process according to claim 4 in which the color-forming composition comprises

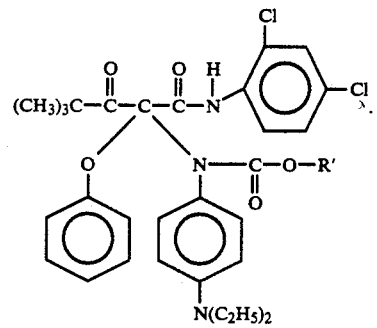

6. A process according to claim 1 wherein the dye-containing photoresist composition further comprises at least one non-thermochromic dye which does not undergo a color change during the heating.

7. A process according to claim 6 wherein the second dye comprises:

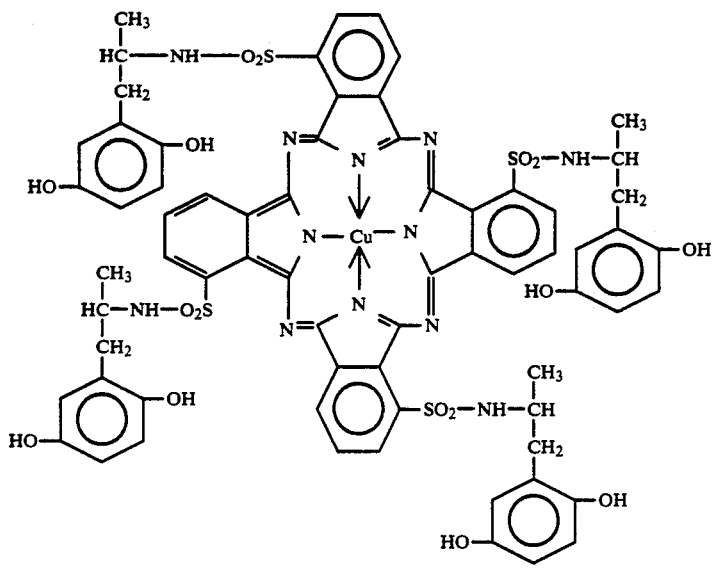

or

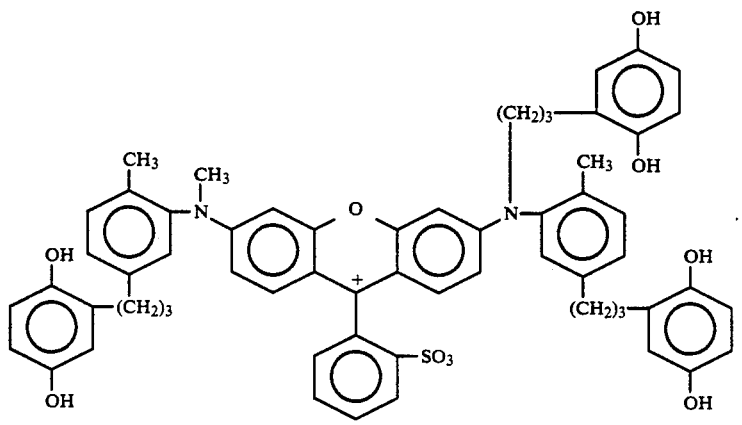

8. A process according to claim 1 wherein the heating of the solid state imager is carried out between about 145° to about 165° C. for a period of not more than about 1 hour.

9. A process according to claim 8 wherein the heating of the solid state imager is carried out at a temperature of not more than about 155° C. for a period of not more than about 40 minutes.

10. A process according to claim 1 wherein the photoresist resin is a positive photoresist resin and the thermochromic dye has substantially the same polarity as the resin.

11. A process according to claim 10 wherein the thermochromic dye comprises in excess of 10% up to about 50% of the dye-containing photoresist composition on a dry weight basis.

12. A process according to claim 10 wherein the photoresist resin is a novolak resin and the dye-containing photoresist composition further comprises a photoactive dissolution rate inhibitor.

13. A process according to claim 12 wherein, in the dye-containing photoresist composition, the novolak is present at a level of about 40-75% by weight, dry basis, the photoactive dissolution rate inhibitor is present at a level of about 10-18% by weight, dry basis, and the thermochromic dye is present at a level in excess of 10% to 50% by weight, dry basis.

14. A process according to claim 1 wherein the solid state imager is a charge coupled device.

15. A process according to claim 14 wherein the charge coupled device is of the type comprising a plurality of spaced apart elements each defined by a surrounding channel stop, the process further comprising the step of predetermining the portions of the composition to be exposed to radiation by masking selected ones of said elements in a manner so that the edges of the filter elements formed upon the subsequent exposure and development of said selectively masked elements extends over the channel stop surrounding said selectively masked elements.

16. A process for forming a filter on a solid state imager, which process comprises:
applying to the imaging surface of the imager a dye-containing photoresist composition comprising a positive photoresist resin and a thermochromic dye, this dye constituting in excess of 10% up to about 50% of the dye-containing photoresist composition on a dry weight basis and having substantially the same polarity as the resin, the dye being substantially non-absorbent of actinic radiation of a first wavelength in the range of about 380 to 500 nm, but capable, upon heating of undergoing a thermally-induced color change which renders it absorptive of actinic radiation of the first wavelength;

drying the dye-containing photoresist composition to form an adherent layer on the imaging surface imagewise exposing the adherent layer of dye-containing photoresist composition to actinic radiation of the first wavelength;

applying a solvent to the exposed layer of dye-containing photoresist composition, thereby removing the exposed areas of the layer to form a pattern of filter elements; and heating the solid state imager to a temperature of not more than about 155° C. for a period of not more than about 40 minutes, thereby causing the thermochromic dye to undergo its color change, and the filter elements to become absorptive of radiation of the first wavelength.

17. A solid state imager having on its imaging surface a filter comprising a plurality of colored filter elements, the filter being formed of a photoresist resin and an image dye which absorbs radiation of a first wavelength in the range of about 360 to 530 nm, the image dye being formed from a thermochromic dye which is substantially non-absorbent of actinic radiation of the first wavelength, but which, upon heating, generates said image dye.

* * * * *